United States Patent
Shimizu et al.

(10) Patent No.: US 7,907,446 B2
(45) Date of Patent: Mar. 15, 2011

(54) NONVOLATILE SEMICONDUCTOR MEMORY DEVICE AND METHOD OF DRIVING THE SAME

(75) Inventors: Yuui Shimizu, Yokohama (JP); Toshiaki Edahiro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 145 days.

(21) Appl. No.: 12/266,734

(22) Filed: Nov. 7, 2008

(65) Prior Publication Data

US 2009/0122611 A1 May 14, 2009

(30) Foreign Application Priority Data

Nov. 12, 2007 (JP) ................................. 2007-293349

(51) Int. Cl.
*G11C 16/04* (2006.01)
*G11C 8/00* (2006.01)
*G11C 11/34* (2006.01)
*G11C 16/06* (2006.01)

(52) U.S. Cl. ......... 365/185.11; 365/230.03; 365/185.23; 365/185.22; 365/185.24

(58) Field of Classification Search ................... None
See application file for complete search history.

(56) References Cited

U.S. PATENT DOCUMENTS

| 7,257,032 | B2 | 8/2007 | Fujiu et al. | |
|---|---|---|---|---|
| 2006/0239070 | A1* | 10/2006 | Yen et al. | 365/185.01 |
| 2007/0153577 | A1* | 7/2007 | Guterman | 365/185.17 |
| 2008/0055985 | A1 | 3/2008 | Kanda | |

OTHER PUBLICATIONS

U.S. Appl. No. 12/491,638, filed Jun. 25, 2009, Futatsuyama et al.

* cited by examiner

*Primary Examiner* — Hoai V Ho
*Assistant Examiner* — James G Norman
(74) *Attorney, Agent, or Firm* — Oblon, Spivak, McClelland, Maier & Neustadt, L.L.P.

(57) ABSTRACT

This disclosure concerns a memory including cell blocks, wherein in a first write sequence for writing data to a first cell block, drivers write the data only to memory cells arranged in a form of a checkered flag among the memory cells included in the first cell block, in a second write sequence for writing the data from the first cell block to a second cell block, the drivers write the data to all memory cells connected to a word line selected in the second cell block, and when the data is read from the first cell block or at a time of data verification when data is written to the first cell block, the word line drivers simultaneously apply a read voltage to two adjacent word lines, and the sense amplifiers detects the data in the memory cells connected to the two word lines.

19 Claims, 8 Drawing Sheets

NONVOLATILE SEMICONDUCTOR MEMORY DEVICE AND METHOD OF DRIVING THE SAME

CROSS-REFERENCE TO RELATED APPLICATION

This application is based upon and claims the benefit of priority from the prior Japanese Patent Application No. 2007-293349, filed on Nov. 12, 2007, the entire contents of which are incorporated herein by reference.

BACKGROUND OF THE INVENTION

1. Field of the Invention

The present invention relates to a nonvolatile semiconductor memory device and a method of driving the semiconductor memory device.

2. Related Art

In recent years, microfabrication of nonvolatile memories such as NAND flash memories has increasingly proceeded. When an interval between adjacent memory cells is narrower to follow microfabrication in machining, proximity effect between the memory cells becomes conspicuous. The proximity effect is interference affected by the memory cell from an adjacent memory cell by capacitive coupling, and the like, between a plurality of adjacent memory cells. For example, charges accumulated in a memory cell adjacent to the memory cell influence data stored in the memory cell. As the interval between the adjacent memory cells is narrower, the influence affected by the charges of the adjacent memory cell becomes greater.

To correctly read the data stored in a memory cell, it is necessary that a threshold voltage of the memory cell falls within a predetermined range. Normally, right after data is written, a threshold voltage of a certain memory cell remains within a predetermined range. However, when the data is thereafter written to the adjacent memory cell, the threshold voltage of the memory cell fluctuates by the proximity effect. This causes erroneous reading of data.

For example, in a multivalued memory cell capable of storing data of two bits or more, a permissible range for the threshold voltage of the memory cell is very narrow. The capacitive coupling between the adjacent cells by the proximity effect expands a threshold distribution, and thus there is a need of much narrowing the threshold distribution of the memory cell than that of a binary memory. Accordingly, in a conventional program operation (write operation), a step-up voltage needs to be small, and the number of steps to reach a desired write threshold value increases. As a result, there is a problem that a programming time is prolonged (write rate becomes slow).

SUMMARY OF THE INVENTION

A semiconductor memory device according to an embodiment of the present invention comprises a plurality of word lines extending in a first direction; a plurality of bit lines extending in a second direction crossing the first direction; a plurality of cell blocks respectively including a plurality of memory cells provided to correspond to crosspoints in a form of a lattice constituted by the word lines and the bit lines; sense amplifiers provided to correspond to each of the bit lines, the sense amplifiers detecting data stored in the memory cells; bit line drivers connected to the bit lines; and word line drivers connected to the word lines, wherein in a first write sequence for writing data received from outside to a first cell block among the cell blocks, the word line drivers and the bit line drivers write the data only to memory cells arranged in a form of a checkered flag among the memory cells included in the first cell block, in a second write sequence for writing the data written in the first cell block to a second cell block among the cell blocks, the word line drivers and the bit line drivers write the data to all memory cells connected to word lines selected in the second cell block, and when the data is read from the first cell block or at a time of data verification when data is written to the first cell block, the word line drivers simultaneously apply a read voltage to two adjacent word lines, and the sense amplifiers detects the data in the memory cells connected to the two word lines.

A semiconductor memory device according to an embodiment of the present invention comprises a plurality of word lines extending in a first direction; a plurality of bit lines extending in a second direction crossing the first direction; a plurality of cell blocks formed by a plurality of memory cells provided to correspond to crosspoints in a form of a lattice constituted by the word lines and the bit lines; sense amplifiers provided to correspond to each of the bit lines, the sense amplifiers detecting data stored in the memory cells; bit line drivers connected to the bit lines; and word line drivers connected to the word lines, wherein in a first write sequence for writing data received from outside to a first cell block among the cell blocks, the word line drivers raise voltage of the word lines by a first step-up width, in a second write sequence for writing the data written in the first cell block to a second cell block among the cell blocks, the word line drivers raise voltage of the word lines by a second step-up width, and the first step-up width is larger than the second step-up width.

A method of driving a semiconductor memory device according to an embodiment of the present invention, the semiconductor memory device including: a plurality of word lines extending in a first direction; a plurality of bit lines extending in a second direction crossing the first direction; a plurality of cell blocks formed by a plurality of memory cells provided to correspond to crosspoints in a form of a lattice constituted by the word lines and the bit lines; sense amplifiers provided to correspond to each of the bit lines, the sense amplifiers detecting data stored in the memory cells; bit line driving circuits connected to the bit lines; and word line driving circuits connected to the word lines, wherein the method of driving a semiconductor memory device comprises:

writing the data to memory cells arranged in a form of a checkered flag in the first cell block by the word line drivers and the bit line drivers, at a time of a first write sequence for writing data received from outside to a first cell block among the cell blocks;

writing data to all memory cells included in the second cell block by the word line drivers and the bit line drivers, at a time of a second write sequence for writing the data written in the first cell block to a second cell block out of the cell blocks; and applying a read voltage to the two adjacent word lines by the word line drivers, and detecting the data in the memory cells connected to the two word lines by the sense amplifiers, at a time of a read operation of the data written in the first write sequence.

A method of driving a semiconductor memory device according to an embodiment of the present invention, the semiconductor memory device includes: a plurality of word lines extending in a first direction; a plurality of bit lines extending in a second direction crossing the first direction; a plurality of cell blocks formed by a plurality of memory cells provided to correspond to crosspoints in a form of a lattice constituted by the word lines and the bit lines; sense amplifiers provided to correspond to each of the bit lines, the sense amplifiers detecting data stored in the memory cells; bit line drivers connected to the bit lines; and word line drivers connected to the word lines, wherein the method of driving a semiconductor memory device comprises:

raising voltage of the word lines by a first step-up width by the word line drivers, at a time of a first write sequence for writing data received from outside to a first cell block among the cell blocks; and raising voltage of the word lines by a second step-up width by the word line driving circuits, at a time of a second write sequence for writing the data written in the first cell block to a second cell block among the cell blocks, wherein the first step-up width is larger than the second step-up width.

DETAILED DESCRIPTION OF THE INVENTION

Embodiments of the present invention will be explained below in detail with reference to the accompanying drawings. Note that the invention is not limited thereto.

First Embodiment

Figure 1:
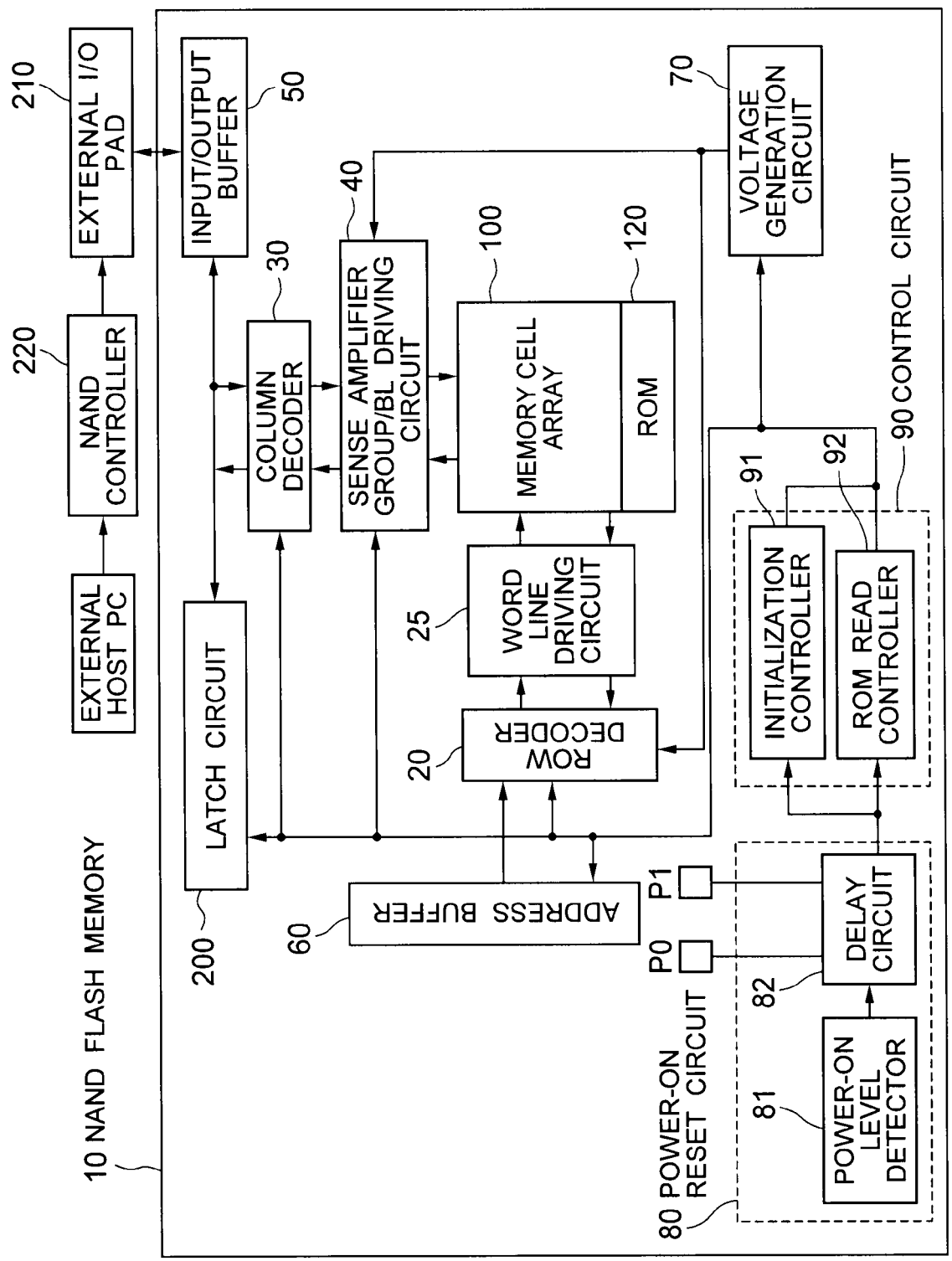
FIG. 1 is a block diagram showing an example of a configuration of a NAND flash memory 10 according to a first embodiment of the present invention.

FIG. 1 is a block diagram showing an example of a configuration of a NAND flash memory 10 (hereinafter, simply "memory 10") according to a first embodiment of the present invention. The memory 10 includes a memory cell array 100, a row decoder 20, a word line driving circuit 25, a column decoder 30, a sense amplifier group/bit line driving circuit 40 (hereinafter, simply, "sense amplifier" or "bit line driving circuit"), an input/output buffer 50, an address buffer 60, a voltage generation circuit 70, a power ON reset circuit 80, a control circuit 90, a latch circuit 200, an external I/O pad 210, and a NAND controller 220. While the memory 10 also includes a state machine, a command interface or the like, they are not shown in FIG. 1.

The NAND controller 220 outputs data and a control signal (command). The data and the control signal are input to the input/output buffer 50 via the external I/O pad. The input/output buffer 50 transmits the data and the control signal to the command interface and the column decoder 30. The state machine controls the column decoder 30 and the row decoder 20 based on the data and the control signal. The row decoder 20 decodes the control signal and selects a certain word line based on an address signal. The word line driving circuit 25 applies voltage to the selected word line to drive the word line. The column decoder 30 is provided between the sense amplifier group/bit line driving circuit 40 and a data bus. The column decoder 30 selects one of the sense amplifier and the bit line driving circuit. The column decoder 30 transfers read data latched to the selected sense amplifier to the data bus, or transfers data received from the outside to the selected bit line driving circuit.

At the time of a data write operation, the sense amplifier/bit line driving circuit 40 latches the data once, and writes the data to memory cells connected to the selected word line via a bit line BL on the corresponding column. At the time of a data read operation, the sense amplifier/bit line driving circuit 40 detects the data stored within the memory cells connected to the selected word line. The sense amplifier/bit line driving circuit 40 outputs the read data to the outside of the memory 10 via the input/output buffer 50 and the external I/O pad 210. The sense amplifier/bit line driving circuit 40 writes or reads the data in units of pages each including, for example, 8-bit data or 16-bit data.

The address buffer 60 encodes address information received from the outside and transmits the encoded address information to the row decoder 20 and the column decoder 30.

The voltage generation circuit 70 receives a mode signal, a voltage generation timing control signal, and a voltage level setting signal from the control circuit 90, and generates a reference voltage Vref for reference or internal voltages such as a program voltage Vpgm using a power supply voltage VCC supplied from the outside. The voltage generation circuit 70 supplies the internal voltage to the row decoder 20, the column decoder 30, the sense amplifier 40, the word line driving circuit 25, and the like.

The power ON reset circuit 80 detects power ON, resets a register in the control circuit 90, and outputs a signal for performing an initialization operation. The power ON reset circuit 80 outputs a power ON reset signal that is kept low level until the power supply voltage reaches a predetermined voltage level after power ON and that becomes high level when the power supply voltage reaches the predetermined voltage level.

The control circuit 90 generates a mode signal indicating the data read operation, the data write operation, a data erasure operation, and the like, according to the command received from the outside. Further, the control circuit 90 outputs a timing control signal indicating a timing of generating a necessary voltage in each mode, a voltage setting signal indicating a set voltage stored in the register, an address control signal, and an access control signal controlling an access to the memory cells MCs. In response to the power ON reset signal, an initialization control circuit 91 outputs a control signal for initializing the address buffer 60, the row decoder 20, the column decoder 30, the sense amplifier/bit line driving circuit 40, the latch circuit 200, and the voltage generation circuit 70. In response to the power ON reset signal, a ROM read control circuit 92 outputs a control signal for starting a ROM read operation.

A ROM 120 stores therein trimming data for a timer adjustment and various voltage adjustment, various data (fuse data)

necessary to read after power ON, replacement address data (redundancy data) for replacing a defective cell present in the memory cell array 100 by another redundant cell, and the like. The fuse data and the redundancy data stored in the ROM 120 are transmitted to the latch circuit 200 via the sense amplifier group 40 and the column decoder 30, and held in the latch circuit 200. This operation is called "ROM read operation".

The sense amplifier/bit line driving circuit 40 includes a plurality of sense amplifiers provided to correspond to bit lines BLs, respectively, and a plurality of bit line driving circuits provided to correspond to bit lines BLs, respectively. Each sense amplifier reads data stored in memory cells MCs via the bit line BL, and each bit line driving circuit writes the data in the memory cells MCs. Each sense amplifier/bit line driving circuit 40 has a latch function, and is configured to be able to temporarily hold the read data or the data to be written.

Figure 2:
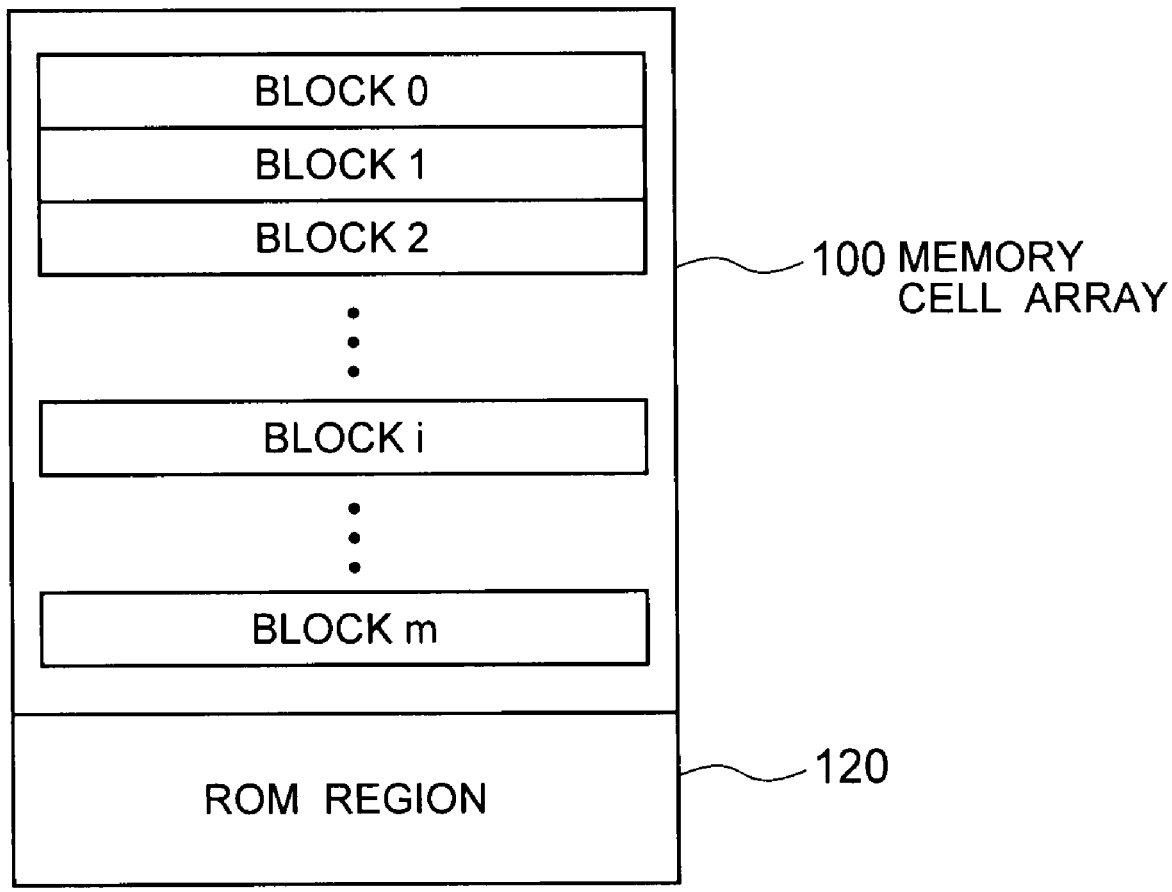
FIG. 2 shows an example of a configuration of the memory cell array 100.

FIG. 2 shows an example of a configuration of the memory cell array 100. The memory cell array 100 is divided into memory cell blocks (hereafter, also "blocks") BLOCK0 to BLOCKm. In the example shown in FIG. 2, each of the blocks BLOCK0 to BLOCKm is a minimum unit for erasing the data. In addition, the blocks can be configured to include an arbitrary number of memory cells. Each of the blocks BLOCK0 to BLOCKm is configured by a plurality of pages. A page is a unit for reading or writing data. Each page corresponds to one word line WL and is configured to include data stored in a plurality of memory cells identified by a certain row address.

Figure 3:
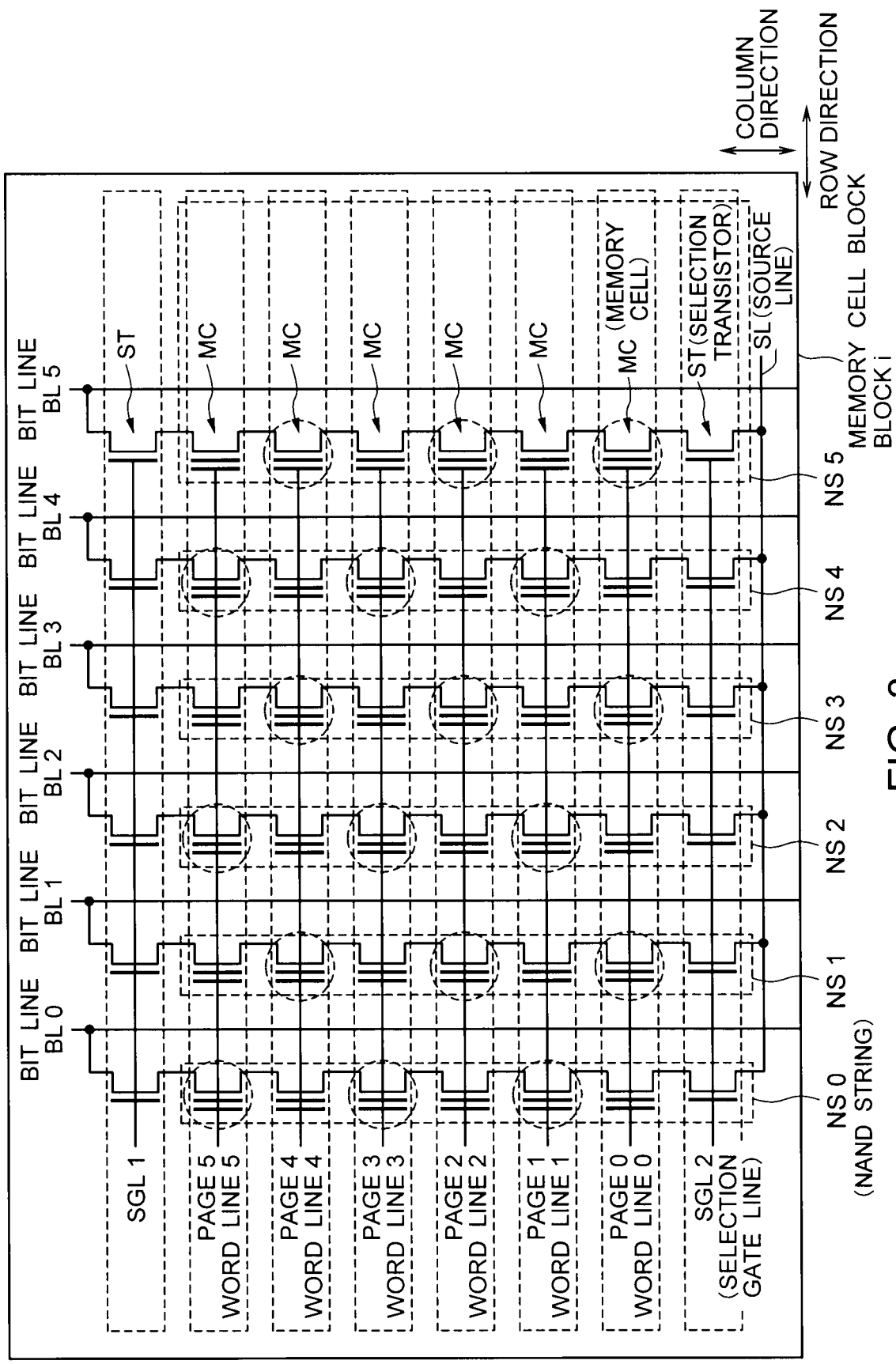
FIG. 3 shows an example of a configuration of each of the blocks BLOCK0 to BLOCKm.

FIG. 3 shows an example of a configuration of each of the blocks BLOCK0 to BLOCKm. A certain block BLOCKi (i=0 to m) includes a plurality of NAND strings NSs provided to correspond to the bit line BL on each column. Each of the NAND strings NSs is formed by a plurality of memory cells MCs connected in series and selection gate transistors STs connected to both ends of these memory cells MCs. One end of each NAND string NS is connected to the corresponding bit line BL and the other end thereof is connected to a common source line SL. For example, a NAND string SNi (i=0 to 5) is connected to a bit line BLi (i=0 to 5), respectively.

A control gate of each memory cell MC is connected to the word line WL on the page to which the memory cell MC belongs. For example, the control gate of each memory cell MC belonging to a page i (i=0 to 5) 15 is connected to a word line WLi (i=0 to 5). A gate of each selection transistor ST is connected to a selection gate line SGL1 or SGL2.

A plurality of word lines WLs extend to a row direction that is a first direction, and a plurality of bit lines BLs extend to a column direction that is a second direction crossing the row direction almost diagonally. Since the row direction and the column direction are so called for the sake of convenience, the first direction can be set as the column direction and the second direction can be set as the row direction.

As shown in FIG. 3, the memory cells MCs are provided to correspond to crosspoints in the form of a lattice constituted by the word lines WLs and the bit lines BLs. For example, the crosspoints in the form of a lattice constituted by word lines WL0 to WL5 and bit lines BL0 to BL5 are located in a matrix of 6×6. The memory cells MCs are arranged two-dimensionally in the matrix of 6×6 to correspond to these crosspoints. In the first embodiment, each block includes 6×6(=36) memory cells MCs. However, the number of memory cells MCs in one block is not limited to 36. That is, the number of word lines WLs and the number of bit lines BLs are not limited to six, respectively.

Each memory cell MC is constituted by an n-FET (Field-Effect Transistor) having a floating gate and a control gate. A potential is applied to the control gates by the word line WL, and charges (for example, electrons) are accumulated in the floating gate or the charges are emitted from the floating gate. By doing so, data is written in the memory cell MC or the data in the memory cell MC is erased. The memory cell MC can electrically store therein binary data or multivalued data according to the number of charges accumulated in the floating gate.

As described above, in the conventional NAND flash memory, resulting from the microfabrication, the influence of the proximity effect gradually becomes conspicuous. As a result, there is a need of setting as small a step-up voltage $\Delta Vpgm$ of the program voltage Vpgm applied to the selected word line WL at the time of writing the data. When the step-up voltage $\Delta Vpgm$ is diminished, a programming time (writing time) Tpgm is prolonged.

Upon receipt of a write command from the outside a memory chip, the NAND flash memory writes the data to memory cells MCs arranged in the form of a checkered flag, out of the memory cells MCs included in a first cell block (first write sequence). For example, the data are written in the memory cells MCs indicated by a dotted circle in FIG. 3, and no data are written in the other memory cells MCs. The memory cells MCs in which no data are written are in an erase state. When the data are written in the memory cells MCs arranged in the form of a checkered flag, no data are written in memory cells adjacent to a column direction or a row direction of memory cells that are writing targets. As a result, the influence of the proximity effect resulting from the adjacent memory cells can be reduced. Since the influence of the proximity effect can be reduced, the step-up voltage $\Delta Vpgm1$ can be made larger than a conventional technique, and the programming time (writing time) becomes faster.

Next, the data written in the first cell block is copied to a second cell block different from the first cell block (a second write sequence). At this time, the sense amplifier reads the data written in the memory cells arranged in the form of a checkered flag in the first cell block. The word line driving circuits 25 and the bit line driving circuits 40 write the read data in all the memory cells connected to the selected word lines WLs in the second cell block.

When the data is read from the first cell block, the word line driving circuit 25 simultaneously applies a read voltage to the two adjacent word lines WLs. Each of the sense amplifiers detects the data in the memory cells MCs connected to the selected two word lines WLs. In the first cell block, the data is stored only in the memory cells MCs arranged in the form of a checkered flag. That is, as shown in FIG. 3, when one word line WL is focused, the data is intermittently stored in every other memory cell MC. When the two adjacent word lines WLs are focused, the data is stored in memory cells MCs adjacent in a diagonal direction in the form of a lattice constituted by the bit lines BLs and the word lines WLs. Accordingly, when the two adjacent word lines WLs are simultaneously selected, the data is read to the bit line BL on each column. Each of the sense amplifiers is provided to correspond to the bit line BL on each column, and thus when the two word lines WLs are simultaneously driven, the data propagated to each bit line BL can be detected.

For example, when the word lines WL0 and WL1 are simultaneously selected, the data in the memory cells MCs connected to the word line WL0 are propagated to the bit lines BL1, BL3, and BL5. To the bit lines BL0, BL2, and BL4, the data in the memory cell MC connected to the word line WL1 are propagated. Accordingly, each sense amplifier can simultaneously detect the data in the memory cells MCs connected to the two adjacent word lines WL0 and WL1. In this way, when the two word lines WLs are simultaneously driven, the read operation becomes faster.

The read operation can not only be used at the time of block-copying the data from the first cell block to the second cell block but also be used for a verifying operation after the data is written to the first cell block at the time of the write operation, as described later. Thereby, the verifying operation also becomes faster. When a method of reading in the verifying operation is set to the same method of reading in a normal operation, data verification can be precisely executed.

In the second cell block, the data can be written to all the memory cells MCs, as data writing targets. The data read from the memory cell MC connected to the two adjacent word lines WLs in the first cell block can be written in all the memory cells MCs connected to one word line WL in the second cell block. That is, a total data capacity within the second cell block corresponds to two times that of the first cell block. Accordingly, when the data of the two first cell blocks are copied to one second cell block, the data can be compression-copied to half the original data.

When the data is written to the second cell block, all the memory cells are writing targets, and thus there is a need of taking into consideration the influence of the proximity effect. Accordingly, a step-up voltage ΔVpgm2 in the second write sequence is set to substantially the same level as that in the conventional technique. In this case, the programming time (writing time) does not become faster as compared to the conventional method. However, the block copy from the first cell block to the second cell block can be executed in a standby time (in a vacant time or in background) between a certain write operation and a subsequent write operation, for example. An instruction of the block copy is issued toward the memory 10 at a desired timing (for example, at the time of a start of the standby) by the NAND controller 220 shown in FIG. 1. Thus, the memory 10 can execute the second write sequence without giving a user a chance to recognize it. That is, only the high rate writable first write sequence is recognized by the user, and thus, as a whole, the user is made to feel that a write rate becomes faster than the conventional technique. In the second cell block of a block copying target, all the memory cells MCs permit writing, and thus a storage capacity of the memory 10 is not substantially decreased from the conventional memory storage capacity. After executing the block copy, the released first cell block can be used again as a high rate writable cell block.

Figure 4:
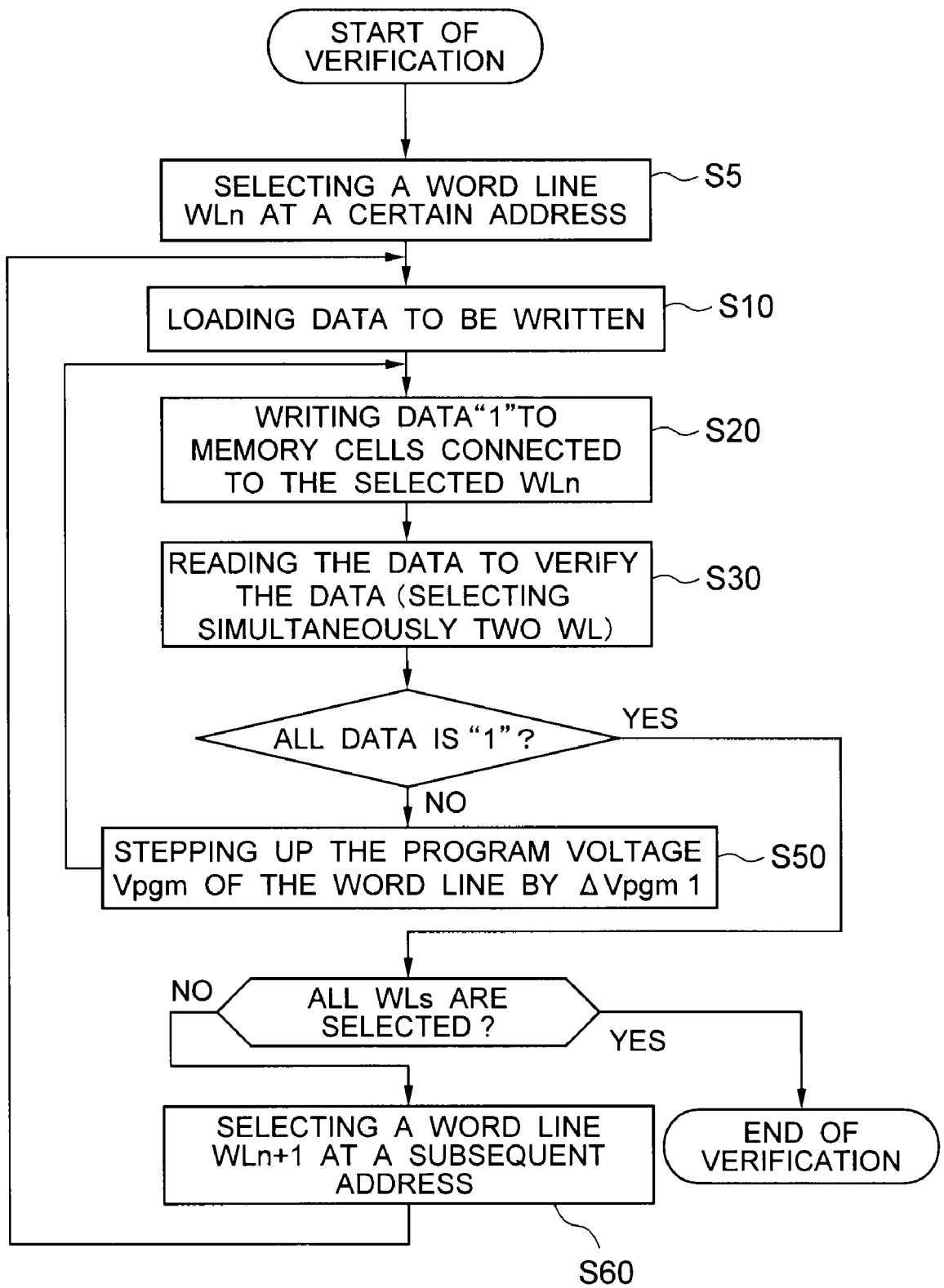
FIG. 4 is a flowchart showing the data write operation to the first cell block and the verifying operation of the written data.

FIG. 4 is a flowchart showing the data write operation to the first cell block and the verifying operation of the written data (the first write sequence). The verifying operation of the first cell block is executed as a result of the bit line driving circuits writing data "1" in the memory cells MCs arranged in the form of a checkered flag and the sense amplifiers reading the data "1". First, a word line WLn at a certain address is selected (S5). The data to be written to the memory cells MCs connected to the selected word line WLn is loaded from the outside of the memory 10 (S10). At this time, in the verifying data, all logical values are "1".

Next, the data "1" are written to the first cell block (S20). At this time, the word line driving circuit and the bit line driving circuit select one of two adjacent word lines WLn and WLn+1. The bit line driving circuit writes the data to every other memory cell MC connected to one selected word line WLn. Out of the memory cells MCs connected to the word line WLn, memory cells other than writable memory cells are in an access prohibited state. The write operation is executed using QPW (Quick Pass Write), for example.

Subsequently, to verify the data within the first cell block, the sense amplifier reads the data (S30). At this time, as described above, the word line driving circuit 25 simultaneously selects both of the two adjacent word lines WLn and WLn+1. In the memory cells MCs connected to the word line WLn, the data are stored. However, in the memory cells MCs connected to the word line WLn+1, no data are stored. Accordingly, the data in the memory cells MCs connected only to the word line WLn are verified.

For the word line WLn+1 in which the data write is not executed, originally, the read operation for verification is not necessary. However, in the read operation in the normal operation, the two word lines WLn and WLn+1 are simultaneously driven. To ensure the precision of the verification, an environment for the verifying operation is preferably the same as that for the normal operation.

When all the data to be verified are not "1", the program voltage Vpgm is stepped up by ΔVpgm1 (S50). Thereafter, steps S20 to S50 are repeated. That is, while the program voltage Vpgm applied to the selected word line WLn is stepped up by each ΔVpgm1, writing the data "1" and reading the same for verification are repeatedly executed.

When all the read data are "1", the word line WLn+1 corresponding to a subsequent address is selected (S60). That is, the word line driving circuit and the bit line driving circuit select the other one of the two adjacent word lines WLn and WLn+1. Further, steps S10 to S60 are repeated. At step S30, the two adjacent word lines WLn and WLn+1 are selected, and thus the sense amplifiers read the data from the memory cells MCs connected both to the two adjacent word lines WLn and WL+1. Thereby, the data written in both of the word lines WLn and WLn+1 can be verified.

Thereafter, the data are written to the memory cells MCs connected to a word line WLn+2, and in this state, the word lines WLn+2 and WLn+3 are selected to verify the data. The data are written to the memory cells MCs connected to the word line WLn+3, and in this state, the word lines WLn+2 and WLn+3 are selected to verify the data. When such an operation is repeated and selection of all the word lines WLs that are writing targets is ended, the verification of the memory cells MCs arranged in the form of a checkered flag in the first cell block is completed.

Figure 5:
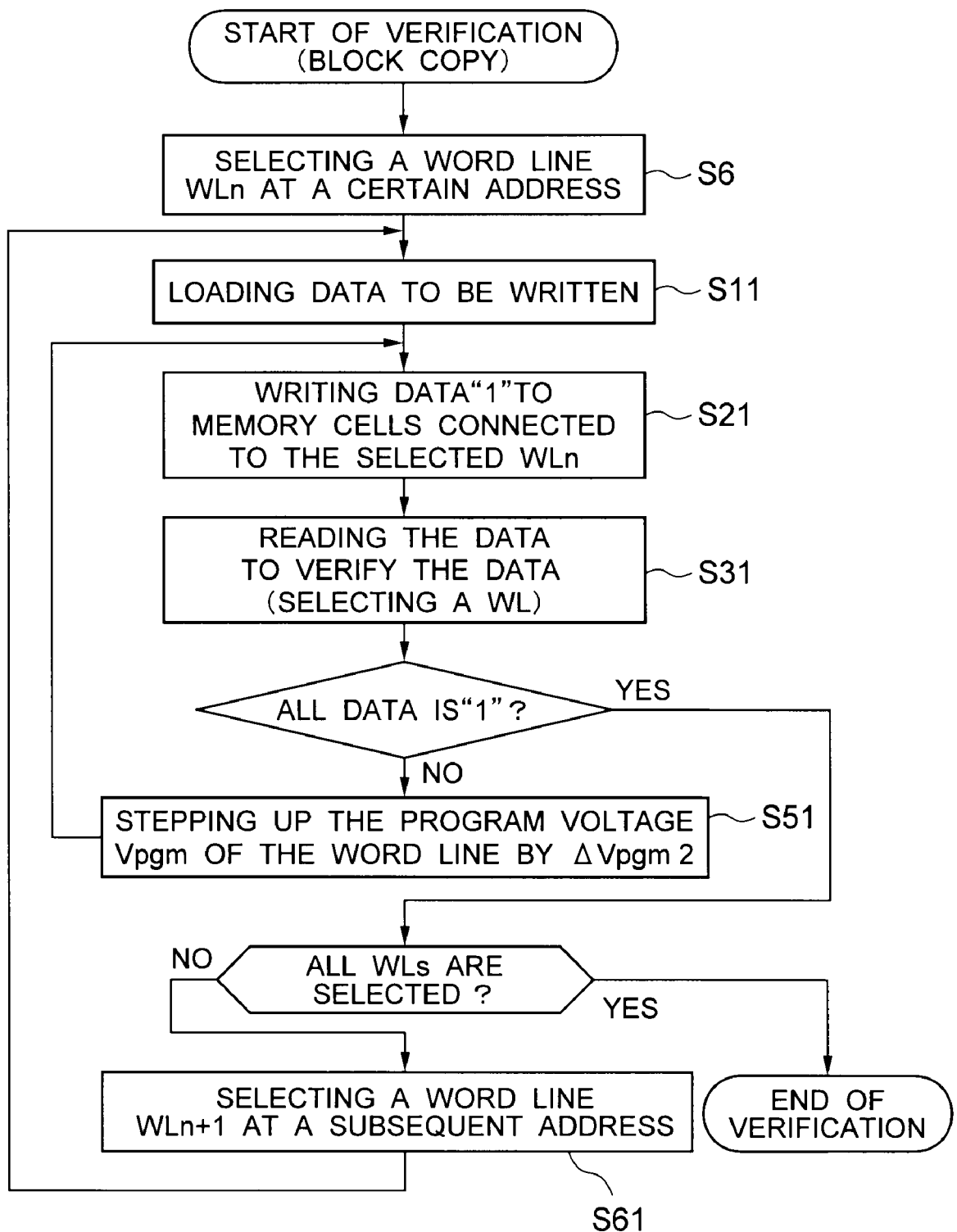
FIG. 5 is a flowchart showing the data write operation to the second cell block and the verifying operation of the written data.

FIG. 5 is a flowchart showing the data write operation to the second cell block and the verifying operation of the written data (the second write sequence). The verifying operation of the second cell block is executed as a result of the bit line driving circuits writing data "1" in all the memory cells MCs and the sense amplifiers reading the data "1". First, a word line WLn at a certain address is selected (S6). The data to be written to the memory cells MCs connected to the selected word line WLn are loaded (S11). At this time, the data to be loaded are the data read in the first cell block. In the first cell block, at the time of data reading, the two adjacent word lines WLs are simultaneously selected. The data read by selecting the two word lines WLs in the first cell block can be stored in the memory cells MCs connected to one word line WL in the second cell block. Accordingly, as described below, in the second cell block, the write operation and the verifying operation are executed for each word line WL as in the conventional technique.

The data "1" are written to the second cell block (S21). At this time, the word line driving circuit 25 and the bit line driving circuit select the word line WLn. The bit line driving circuit writes the data to all the memory cells MCs connected to one selected word line WLn. The write operation is executed by using QPW, for example.

Next, to verify the data within the second cell block, the sense amplifier reads the data (S31). At this time, the word line driving circuit 25 selects the word line WLn only.

Thereby, the data in all the memory cells MCs connected to the word line WLn are verified.

When all the data to be verified are not "1", the program voltage Vpgm is stepped up only by ΔVpgm2 (S51). Thereafter, steps S21 to S51 are repeated. That is, while the program voltage Vpgm applied to the selected word line WLn is stepped up by each ΔVpgm2, writing the data "1" and reading the same for verification are repeatedly executed.

When all the read data are "1", the word line WLn+1 corresponding to a subsequent address is selected (S61). Further, steps S11 to S61 are repeated.

Thereafter, the data are written to the memory cell MC connected to word line WLn+2, and in this state, the word line WLn+2 is selected to verify the data. The data are then written to the memory cells MCs connected to the word line WLn+3, and in this state, the word line WLn+3 is selected to verify the data. When such an operation is repeated and selection of all the word lines WLs that are writing targets is ended, the verification of the memory cells MCs included in the second cell block is completed.

According to the first embodiment, when the data written to the second cell block are read from the first cell block, the two adjacent word lines WLs are simultaneously selected in the first cell block. As a result, the block copy from the first cell block to the second cell block can be quickly executed.

According to the first embodiment, in the verifying operation of the first write sequence, similarly to the normal read operation, the word line driving circuit 25 simultaneously selects the two adjacent word lines WLs. That is, the environment for the verifying operation of the first write sequence and that for the normal read operation are equal, and thus the precision of the verification can be maintained.

In the first embodiment, the first step-up voltage ΔVpgm1 in the first write sequence is larger than the second step-up voltage ΔVpgm2 in the second write sequence. In the first cell block, only the memory cells MCs arranged in the form of a checkered flag are the writing targets, and thus there is substantially no need of taking into consideration the influence caused by the proximity effect. Accordingly, the first step-up voltage ΔVpgm1 in the first write sequence can be large. This shortens the programming time (writing time).

Figure 6A:
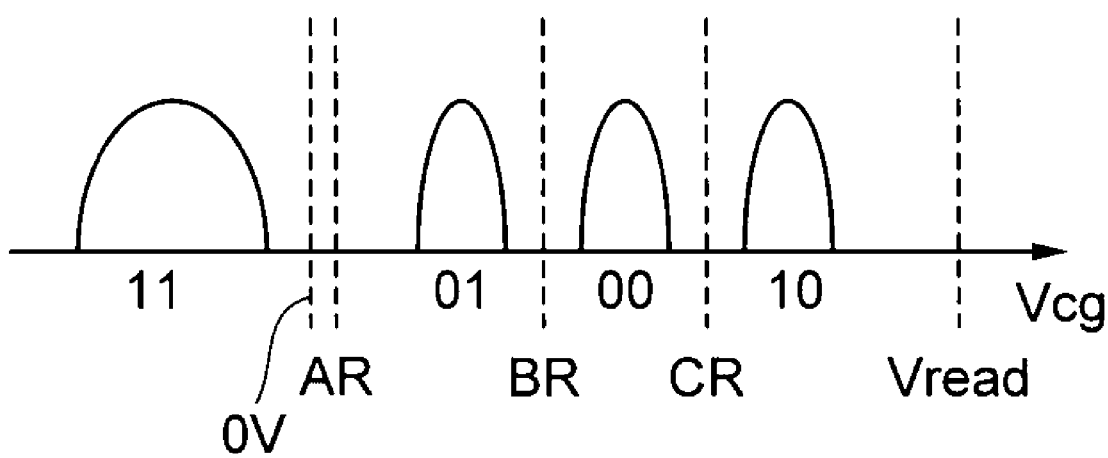
FIGS. 6A and 6B are graphs showing threshold distributions of the memory cells storing multivalued data.

On the other hand, as shown in FIG. 6A, there is a case that after the multivalued data is programmed, a threshold distribution of the memory cell MC is widened. In this case, it is necessary that a first read voltage Vread1 applied to the selected word line WL at the time of reading is higher than a third read voltage Vread3 described later. Generally, when the read voltage is raised, disturbance to unselected memory cell MC connected to the selected word line WL is a concern. However, the data stored in the first cell block are stored in the second cell block by the block copy. Thereafter, the data are read from the second cell block. Thus, the number of times of the data read operations for the first cell block is about a few times, even when including the reading in the verifying operation and reading in the block copy. Accordingly, the disturbance to the unselected memory cells MCs connected to the selected word line WL does not cause a problem.

Figure 6B:
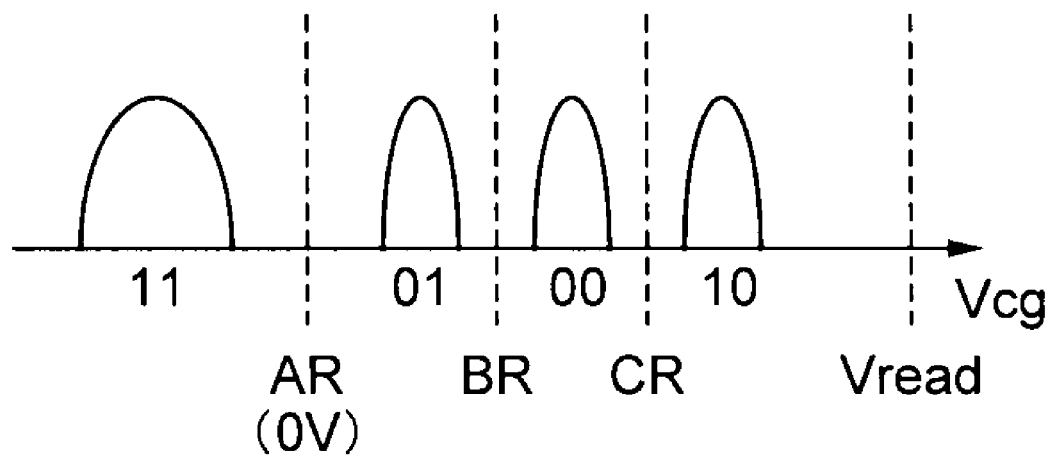

In the second cell block, all the memory cells are writing targets, and thus there is a need of taking into consideration the influence by the proximity effect. Accordingly, the second step-up voltage ΔVpgm2 in the second write sequence needs to be relatively small similarly to the conventional write operation. This enables narrowing the threshold distribution of the memory cells MCs after the multivalued data is programmed, as shown in FIG. 6B. When the threshold distribution of the memory cells MCs is narrow, the third read voltage Vread3 applied to the selected word line WL at the time of reading can be lower than the first read voltage Vread1 in the first cell block. Generally, when the read voltage is low, the disturbance to the unselected memory cells MCs connected to the selected word line WL is small. Accordingly, the second cell block is suitable for read operations for a large number of times. On the other hand, the step-up voltage being small means that the write operation takes time as in the conventional technique. However, as described above, the block copy from the first cell block to the second cell block can be executed in the standby time, and the like, and thus the writing time in the second write sequence being long does not cause a problem.

Thus, according to the first embodiment, the first step-up voltage ΔVpgm1 can be increased and the programming time for the first cell block can be shortened. The data in the first cell block is copied to the second cell block in the standby time, and thus a user needs not to be conscious of the programming time to the second cell block. In the data copied to the second cell block, the number of times of erasures (or the number of times of writings) substantially the same level as that of the conventional technique is permitted.

In the first embodiment, when the data is read from the first cell block, the second read voltage Vread2 applied to the unselected word lines WLs is preferably higher than the first read voltage Vread1 applied to the selected word lines WLs. Thereby, a resistance of the unselected memory cells MCs within the cell string is decreased, and thus back pattern noise at the time of reading becomes small. As a result, the sense amplifiers can detect the data of the selected memory cells MCs at high rate. For example, in the first cell block, the memory cells MCs to which access is prohibited are in an erase state. In this case, resulting from the proximity effect of the adjacent memory cells MCs, the threshold voltage of the memory cells MCs to which access is prohibited may probably rise. This raises a resistance value of the cell string at the time of reading, causing an increase in back pattern noise. To prevent this, the second read voltage applied to the unselected word line WL is raised. Thereby, a rise in resistance value of the cell string at the time of reading is inhibited, and thus the read operation can be maintained at high rate.

Likewise, when the data are read from the second cell block, a fourth read voltage Vread4 applied to the unselected word lines WLs is preferably higher than the third read voltage Vread3 applied to the selected word lines WLs. As a result, the resistance of the unselected memory cells MCs within the cell string becomes low, and thus the sense amplifiers can detect the data of the selected memory cells MCs at high rate. That is, conditions of Vread1<Vread2, Vread3<Vread4, and Vread1>Vread3 are preferably satisfied.

To store a large capacity of data, the memory cells MCs preferably store therein the multivalued data. A multivalued memory is described later.

Second Embodiment

Figure 7:
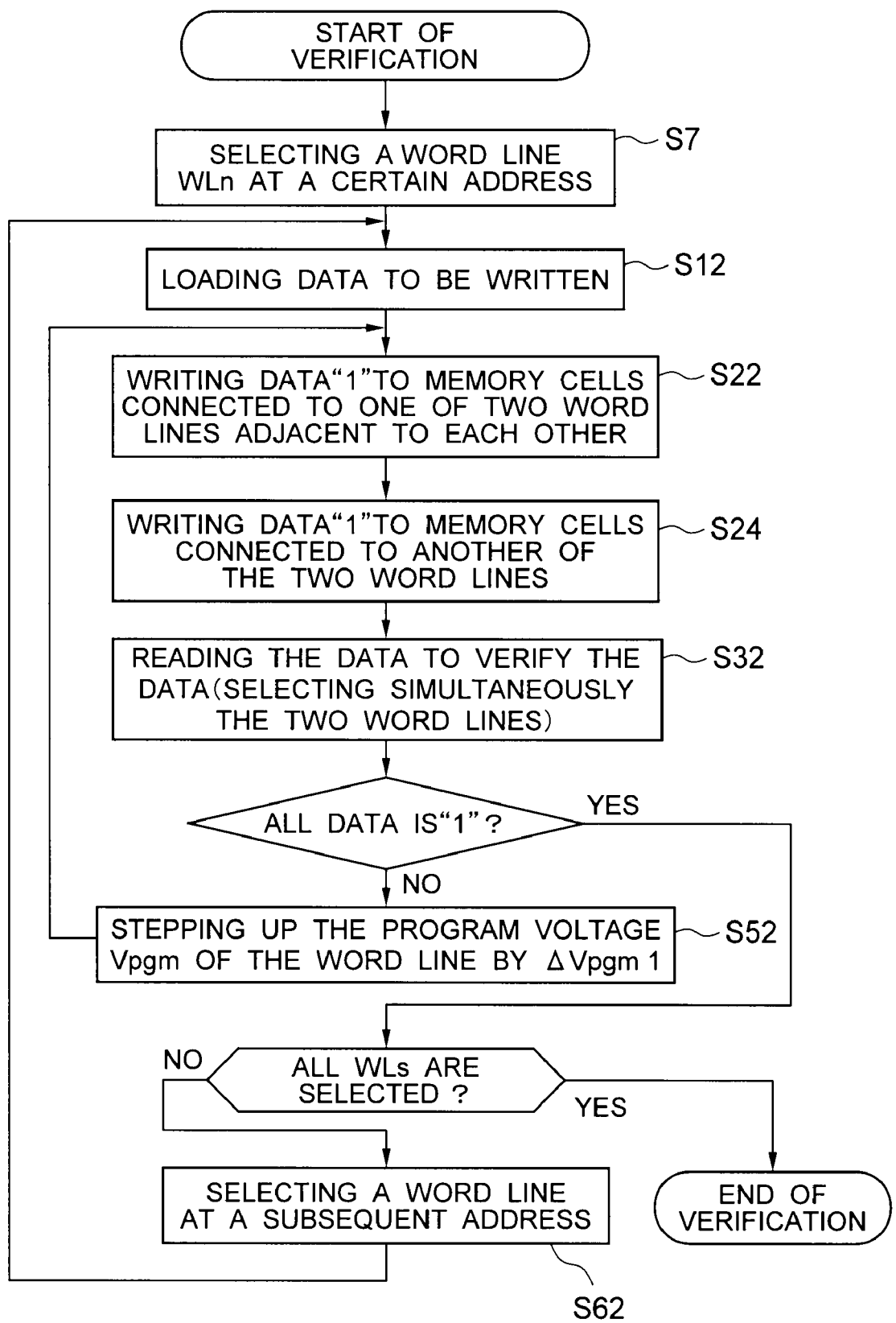
FIG. 7 is a flowchart showing the data write operation to the first cell block and the verifying operation of the written data according to a second embodiment of the present invention.

FIG. 7 is a flowchart showing the data write operation to the first cell block and the verifying operation of the written data according to a second embodiment of the present invention (a modified example of the first write sequence). The second embodiment differs in first write sequence from that of the first embodiment.

First, a word line WLn at a certain address is selected (S7). The data to be written to the memory cells MCs connected to the selected word lines WLn and WLn+1 are loaded from the outside of the memory 10 (S12). Subsequently, the data "1" are written to the first cell block (S22 and S24). At this time, the word line driving circuits 25 and the bit line driving circuits continuously select the two adjacent word lines WLn and WLn+1. The bit line driving circuit firstly writes the data to the memory cells MCs connected to the word line WLn, and thereafter, writes the data to the memory cells MCs connected to the word line WLn+1. As a result, the bit line driving circuits write the data in the form of a checkered flag to a plurality of memory cells MCs connected to the selected word lines WLn and WLn+1. Out of the memory cells MCs connected to the word lines WLn and WLn+1, the memory cells MCs other than the writable memory cells MCs are in an access prohibited state.

Next, to verify the data within the first cell block, each of the sense amplifiers reads the data (S32). At this time, similarly to step S30, the word line driving circuit 25 simultaneously selects both of the two adjacent word lines WLn and WLn+1. By this time, the data are stored in the memory cells MCs connected to both of the word lines WLn and WLn+1. Accordingly, the data in the memory cells MCs connected to both of the word lines WLn and WLn+1 are verified.

When the data that is not "1" is included in the data to be verified, the program voltage Vpgm is stepped up only by ΔVpgm1 (S52). Thereafter, steps S22 to S52 are repeated. That is, while the program voltage Vpgm applied to the selected word line WLn is stepped up by each ΔVpgm1, writing the data "1" and reading the same for verification are repeatedly executed.

When the read data are all "1", word lines WLn+2 and WL+3 corresponding to a subsequent address are selected (S62). Further, steps S12 to S62 are repeated. That is, the word line driving circuits 25 and the bit line driving circuits continuously write the data to the two adjacent word lines WLn+2 and WLn+3. At step S32, the two adjacent word lines WLn+2 and WLn+3 are selected, and thus the sense amplifiers read the data from the memory cells MCs connected to both of the two adjacent word lines WLn+2 and WLn+3. As a result, the data written in both of the word lines WLn+2 and WLn+3 can be verified. When such an operation is repeated and selection of all the word lines WLs that are writing targets is ended, the verification of the memory cells MCs arranged in the form of a checkered flag in the first cell block is completed.

According to the second embodiment, after continuously writing the data to the two adjacent word lines WLs, the data is read for verification. Accordingly, the first write sequence of the second embodiment, which has a fewer number of executions for the verifying operation than that of the first embodiment, is completed in a shorter time than that of the first embodiment. The memory cells MCs according to the second embodiment can store therein the multivalued data similarly to the first embodiment. Other configurations and operations of the second embodiment can be identical to those of the first embodiment. Therefore, the second embodiment can also achieve the effects of the first embodiment.

Third Embodiment

Figure 8A:
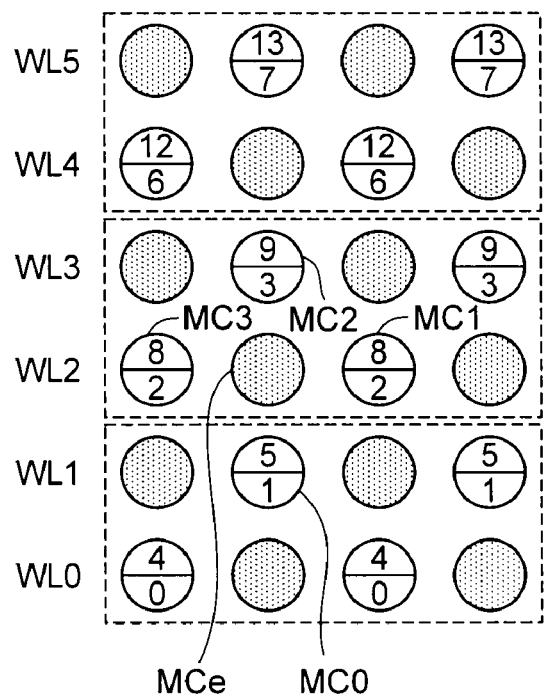
FIG. 8A is a conceptual diagram showing a method for writing the multivalued data to the first cell block according to a third embodiment of the present invention.
Figure 8B:
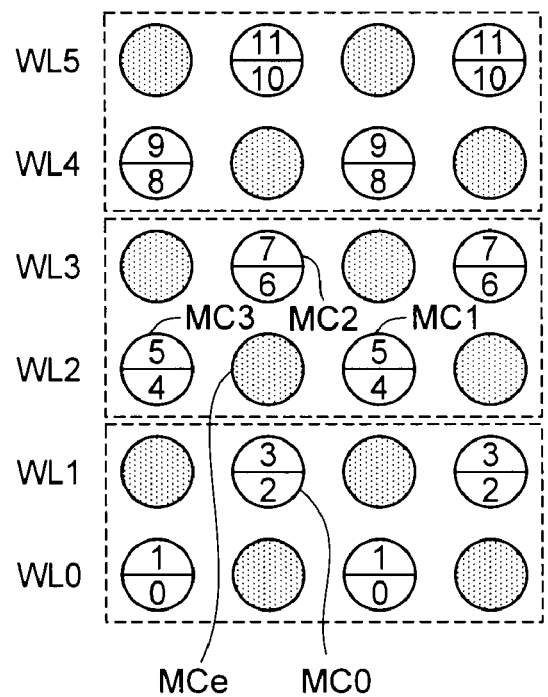
FIG. 8B shows a comparative example of the method for writing data.

FIG. 8A is a conceptual diagram showing a method for writing the multivalued data to the first cell block according to a third embodiment of the present invention. FIG. 8B shows a comparative example of the method for writing data. After the verifying operation, the memory 10 uses an LM (Lower Middle) method, for example, to write four-valued data (2-bit data) to the first cell block.

Hereinafter, the LM method is described. For example, each the memory cell MC stores therein one of the four-valued data (11, 10, 01, and 00). A lower bit of the four-valued data is stored as Lower Page data and an upper bit thereof is stored as Upper Page data in each memory cell MC. In FIG. 8A and FIG. 8B, a write order of the Lower Page data is indicated by a lower semicircle, and a write order of the Upper Page data is indicated by an upper semicircle.

In the LM method, the writing of the four-valued data is executed by two operations of a Lower Page write operation and an Upper Page write operation. The Lower Page write operation determines Lower Page data. A data state in the memory cells MCs is thereby sorted to either (11) or (10). The Upper Page write operation determines Upper Page data. The data state (11) in the memory cells MCs is thereby sorted to either the data (11) or (01), and the data state (10) is sorted to either the data (10) or (00).

In the Lower Page write operation, when the Lower Page data is to be kept 1, the bit lines BLs are set high level, thereby preventing electrons from being accumulated in floating gate of each memory cell MC connected to the selected word line WL. By doing so, each memory cell MC is kept in the data (11) (erase state). On the other hand, when 0 is to be written to the Lower Page data, the bit lines BLs are set low level, thereby accumulating the electrons into the floating gate of each memory cell MC connected to the selected word line WL. By doing so, 0 is written to the Lower Page data, and the memory cell MC stores therein the data (10).

In the Upper Page write operation, when the Upper Page data is to be kept 1, the bit lines BLs are set high level, thereby preventing the electrons from being accumulated in the floating gate of each memory cell MC connected to the selected word line WL. By doing so, each memory cell MC having the data (11) keeps the data (11), and each memory cell MC having the data (10) keeps the data (10). On the other hand, when 0 is to be written to the Upper Page data, the bit lines BLs are set low level, thereby accumulating the electrons in the floating gate of each memory cell MC connected to the selected word line WL. When 0 is to be written to the Upper Page in each memory cell MC having the data (11), the data in each memory cell MC are (01). When 0 is to be written to the Upper Page in each memory cell MC having the data (10), the data within each memory cell MC are (00). At this time, the voltage of the selected word lines WLs is set to be higher than the voltage of the selected word lines WLs in the Lower Page write operation. Alternatively, the potential of the bit lines BLs is set to be lower than the voltage of the bit lines BLs in the Lower Page write operation. By doing so, a quantity of electrons accumulated in the floating gate during the operation of writing 0 as the Upper Page becomes larger than that during the operation of writing 0 as the Lower Page. As a result, the threshold voltage of each memory cell MC having the data (01) is higher than that of the memory cell MC having the data (10), and the data (10) can be discriminated from the data (01). In this way, each memory cell MC could be turned into the four states according to the threshold voltage.

In the method of writing according to the third embodiment, as shown in FIG. 8A, for each memory cell MC adjacent in a column direction or a row direction of the memory cells MCe (that are in an erase state (11)) in an access prohibited state, the Lower Page and the Upper Page of the same memory cells are not to be written continuously. For example, the data is continuously written to each Lower Page of the memory cells MCs connected to the word lines WL0 to WL2 shown in FIG. 8A, and thereafter, the write operation of the Lower Page of the memory cells MCs connected to the word line WL3 is performed. Subsequently thereto, the write operations are executed as follows: the Upper Pages of the word lines WL0 and WL1, the Lower Pages of the word lines WL4 and WL5, the Upper Pages of the word lines WL2 and WL3, the Lower Pages of the word lines WL6 and WL7 (not shown), the Upper Pages of the word lines WL4 and WL5, . . . , the Lower Pages of the word lines WLn and WLn+1, the Upper Pages of the word lines WLn−2 and WLn−1, the Lower Pages of the word lines WLn+2 and WLn+3, and the Upper Pages of the word lines WLn and WLn+1. By doing so, for example, in each memory cell MC0 to MC3 adjacent to a memory cell MCe, the write operation of the Lower Page and that of the Upper Page are not continuous within the same memory cell MC. That is, in a state that a certain word line WL is selected, the data is not continuously written in the Lower Page and the Upper Page of the same memory cell MC.

Normally, when the data is written to a first memory cell, the threshold voltage of a second memory cell adjacent thereto fluctuates resulting from a capacitive coupling with the first memory cell. Accordingly, when the data are written to all the memory cells MC0 to MC4, the threshold voltage of the memory cell MCe fluctuates.

When the Lower Page and the Upper Page are continuously written to the same memory cell MC for each word line WL, as shown in FIG. 8B, there occurs a case that the fluctuation of the threshold voltage of an erasure memory cell MCe is substantially not taken into consideration. For example, in the memory cell MC0, the Lower Page and the Upper Page are continuously written, and thereafter, the write operation of MC1 to MC3 is executed. Thus, in the memory cell MC0, the fluctuation of the threshold voltage of the erasure memory cell MCe resulting from the write operation of MC1 to MC3 is substantially not taken into account. In this case, the data in the memory cell MC0 is probably erroneously detected.

On the other hand, according to the third embodiment, as shown in FIG. 8A, the Lower Page and the Upper Page are not continuously written in the same word line WL, and thus in the memory cell MC0, the fluctuation of the threshold voltage of the erasure memory cell MCe by the write operation of MC1 to MC3 is taken into account to some extent. More specifically, the write operation of the Upper Page in MC0 is performed after the write operation of the Lower Page in MC1 to MC3, and thus the Upper Page in MC0 is written in a state that the fluctuation caused by the write operation of the threshold voltage of the erasure memory cell MCe is taken into account. Thus, the method of writing according to the third embodiment can lower a possibility of the erroneous data detection.

In the first to third embodiments, the first cell block and the second cell block can be discriminated by a flag for each block stored in the ROM 120 in FIG. 1. When the flag is changed, the first cell block can be changed to the second cell block, and in contrary, the second cell block can be changed to the first cell block. To prolong the lifetime of the first cell block, the memory cells MCs to which access is permitted can be replaced by the memory cells MCs to which access is prohibited. For example, the memory cells MCs indicated by dotted circles shown in FIG. 3 are firstly used as an access-permitted cell, and when the number of times of erasures (or the number of times of writings) reaches a predetermined value, the memory cells MCs other than those MCs indicated by the dotted circles can be alternatively used as the access-permitted cell.

Modification of the Embodiments

In the first cell block, the data are stored only in the memory cells MCs arranged in the form of a checkered flag. However, between the memory cells MCs adjacent to the row direction and the column direction, when there is substantially no need of taking into consideration the proximity effect, all the memory cells MCs in the first cell block can be writing targets. In this case, the two word lines WLs cannot be simultaneously selected at the time of reading, the high rate read effect cannot be obtained. However, the first write sequence for writing the data received from the outside to the first cell block and the second write sequence for writing the data written in the first cell block to the second cell block can be both executed. Thus, in the first write sequence, the data are written to the first cell block by a relatively large step-up voltage ΔVpgm1, and in the standby state (in background), the data can be block-copied from the first cell block to the second cell block by the second step-up voltage ΔVpgm2. Similarly to the other embodiments, the first step-up voltage ΔVpgm1 is larger than the second step-up voltage ΔVpgm2. Thereby, in the modification, the high rate write effect in the first write sequence can be obtained. In the second write sequence, the threshold distribution of the memory cells MCs is narrowed, and the read voltage Vread applied to the selected word line WL can be decreased at the time of reading. This can maintain the number of times of erasures (number of times of writings) of the second cell block.

The embodiments can be effectively applied to overall memory elements in which storage elements are arranged in the form of a lattice. Generally, in the memory devices, to meet the demand of a larger capacity, the memory elements are increasingly downsized and the interval between the memory elements is made narrower. At this time, there always occurs a problem of the adverse influence caused by the proximity effect produced between the adjacent memory cells MCs. In this case, a distance between the cells adjacent in a diagonal direction of the lattice shape is larger than that between the cells adjacent in the column direction or the row direction, and thus, when the data are stored in the form of a checkered flag, the proximity effect can be caused to appear small. Accordingly, the embodiments can be effectively applied to not only the NAND flash memory described above but also to overall memory devices in which the memory cells are arranged in the form of a lattice. For example, the embodiments can be applied to a resistance variable memory, and the like. Needless to say, the embodiments can be applied not only to a nonvolatile memory but also to a volatile memory such as a DRAM.

The invention claimed is:

1. A semiconductor memory device comprising:
a plurality of word lines extending in a first direction;
a plurality of bit lines extending in a second direction crossing the first direction;
a plurality of cell blocks respectively including a plurality of memory cells provided to correspond to crosspoints in a form of a lattice constituted by the word lines and the bit lines;
sense amplifiers provided to correspond to each of the bit lines, the sense amplifiers detecting data stored in the memory cells;
bit line drivers connected to the bit lines; and
word line drivers connected to the word lines, wherein
in a first write sequence for writing data received from outside to a first cell block among the cell blocks, the word line drivers and the bit line drivers intermittently write the data to every other memory cell arranged in an extending direction of the word lines and an extending direction of the bit lines, respectively, in the first cell block, memory cells adjacent to a column direction or a row direction of the memory cells in which data is written are in an erased state,
in a second write sequence for writing the data written in the first cell block to a second cell block among the cell blocks, the word line drivers and the bit line drivers write the data to all memory cells connected to word lines selected in the second cell block, and when the data is read from the first cell block or at a time of data verification when data is written to the first cell block, the word line drivers simultaneously apply a read voltage to two adjacent word lines, and the sense amplifiers detect the data in the memory cells connected to the two word lines.

2. A semiconductor memory device comprising:

a plurality of word lines extending in a first direction;

a plurality of bit lines extending in a second direction crossing the first direction;

a plurality of cell blocks formed by a plurality of memory cells provided to correspond to crosspoints in a form of a lattice constituted by the word lines and the bit lines;

sense amplifiers provided to correspond to each of the bit lines, the sense amplifiers detecting data stored in the memory cells;

bit line drivers connected to the bit lines; and word line drivers connected to the word lines, wherein in a first write sequence for writing data received from outside to a first cell block among the cell blocks, the word line drivers raise voltage of the word lines by a first step-up width, in a second write sequence for writing the data written in the first cell block to a second cell block among the cell blocks, the word line drivers raise voltage of the word lines by a second step-up width, and the first step-up width is larger than the second step-up width.

3. The semiconductor memory device according to claim 1, wherein when the data is read from the first cell block, the word line drivers apply a first read voltage to the selected two adjacent word lines and apply a second read voltage higher than the first read voltage to unselected word lines.

4. The semiconductor memory device according to claim 2, wherein when the data is read from the first cell block, the word line drivers apply a first read voltage to the selected two adjacent word lines and apply a second read voltage higher than the first read voltage to unselected word lines.

5. The semiconductor memory device according to claim 2, wherein in the first write sequence, the word line drivers write data to memory cells arranged in a form of a checkered flag among the memory cells included in the first cell block, and in the second write sequence, the word line drivers write the data to all memory cells included in the second cell block.

6. The semiconductor memory device according to claim 3, wherein when the data is read from the second cell block, the word line drivers apply a third read voltage to the selected word lines and applies a fourth read voltage to unselected word lines, and the first read voltage and the second read voltage are higher than the third read voltage and the fourth read voltage, respectively.

7. The semiconductor memory device according to claim 4, wherein when the data is read from the second cell block, the word line drivers apply a third read voltage to the selected word lines and applies a fourth read voltage to unselected word lines, and the first read voltage and the second read voltage are higher than the third read voltage and the fourth read voltage, respectively.

8. The semiconductor memory device according to claim 1, wherein the word line drivers and the bit line drivers write data to the memory cells connected to one of the two adjacent word lines, and at a time of a verifying operation of the written data, the word line drivers and the sense amplifiers read the data from the memory cells connected to both of the two adjacent word lines, the word line drivers and the bit line drivers write the data to the memory cells connected to the other of the two adjacent word lines, and at a time of a verifying operation of the written data, the word line drivers and the sense amplifiers read the data from the memory cells connected to both of the two adjacent word lines.

9. The semiconductor memory device according to claim 1, wherein the word line drivers and the bit line drivers sequentially write data to the memory cells connected to the two adjacent word lines, and at a time of a verifying operation of the written data, the word line drivers and the sense amplifiers read the data from the memory cells connected to both of the two adjacent word lines.

10. The semiconductor memory device according to claim 1, further comprising two selection transistors provided to both ends of cell strings which respectively include the memory cells connected in series, wherein the cell strings are connected to the bit lines via one of the selection transistors, and connected to source lines via the other of the selection transistors, and a gate of each memory cell in one of the cell strings is connected to respectively different word lines.

11. The semiconductor memory device according to claim 2, further comprising two selection transistors provided to both ends of cell strings which respectively include the memory cells connected in series, wherein the cell strings are connected to the bit lines via one of the selection transistors, and connected to source lines via the other of the selection transistors, and a gate of each memory cell in one of the cell strings is connected to respectively different word lines.

12. The semiconductor memory device according to claim 1, wherein the memory cells are multivalued memory cells stored therein with data of two bits or more.

13. The semiconductor memory device according to claim 2, wherein the memory cells are multivalued memory cells stored therein with data of two bits or more.

14. The semiconductor memory device according to claim 1, wherein when verifying the data written in the first cell block and when copying the data from the first cell block to the second cell block, the word line drivers apply a read voltage to the two adjacent word lines in the first cell block and the sense amplifiers detects the data in the memory cells connected to the two adjacent word lines.

15. A method of driving a semiconductor memory device, the semiconductor memory device including:

a plurality of word lines extending in a first direction;

a plurality of bit lines extending in a second direction crossing the first direction;

a plurality of cell blocks formed by a plurality of memory cells provided to correspond to crosspoints in a form of a lattice constituted by the word lines and the bit lines;

sense amplifiers provided to correspond to each of the bit lines, the sense amplifiers detecting data stored in the memory cells;

bit line driving circuits connected to the bit lines; and word line driving circuits connected to the word lines, wherein the method of driving a semiconductor memory device comprises:

writing intermittently the data to every other memory cell arranged in an extending direction of the word lines and an extending direction of the bit lines, respectively, in the first cell block by the word line drivers and the bit line drivers, memory cells adjacent to a column direction or a row direction of the memory cells in which data is written are in an erased state, at a time of a first write sequence for writing data received from outside to a first cell block among the cell blocks;

writing data to all memory cells included in the second cell block by the word line drivers and the bit line drivers, at a time of a second write sequence for writing the data written in the first cell block to a second cell block out of the cell blocks; and applying a read voltage to the two adjacent word lines by the word line drivers, and detecting the data in the memory cells connected to the two word lines by the sense amplifiers, at a time of a read operation of the data written in the first write sequence.

16. The method of driving a semiconductor memory device according to claim 15, further comprising:

applying a read voltage to the two adjacent word lines by the word line drivers, and detecting the data in the memory cells connected to the two word lines by the sense amplifiers, when verifying the data written in the first cell block, and applying a read voltage to the two adjacent word lines in the first cell block by the word line drivers, and detecting the data in the memory cells connected to the two word lines by the sense amplifiers, when copying the data from the first cell block to the second cell block.

17. A method of driving a semiconductor memory device, the semiconductor memory device including;

a plurality of word lines extending in a first direction;

a plurality of bit lines extending in a second direction crossing the first direction;

a plurality of cell blocks formed by a plurality of memory cells provided to correspond to crosspoints in a form of a lattice constituted by the word lines and the bit lines;

sense amplifiers provided to correspond to each of the bit lines, the sense amplifiers detecting data stored in the memory cells;

bit line drivers connected to the bit lines; and word line drivers connected to the word lines, wherein the method of driving a semiconductor memory device comprises:

raising voltage of the word lines by a first step-up width by the word line drivers, at a time of a first write sequence for writing data received from outside to a first cell block among the cell blocks; and raising voltage of the word lines by a second step-up width by the word line driving circuits, at a time of a second write sequence for writing the data written in the first cell block to a second cell block among the cell blocks, wherein the first step-up width is larger than the second step-up width.

18. The semiconductor memory device according to claim 1, further comprising a memory string including the memory cells connected in series.

19. The method of driving a semiconductor memory device according to claim 15, wherein the semiconductor memory device further comprises a memory string including the memory cells connected in series.

* * * * *